United States Patent [19]

Tanaka et al.

[11] Patent Number: 4,975,641
[45] Date of Patent: Dec. 4, 1990

[54] INTEGRATED CIRCUIT AND METHOD FOR TESTING THE INTEGRATED CIRCUIT

[75] Inventors: Shigeki Tanaka, Nara; Koji Imura, Kitakatsuragi, both of Japan

[73] Assignee: Sharp Kabushiki Kaisha, Osaka, Japan

[21] Appl. No.: 341,753

[22] Filed: Apr. 21, 1989

[30] Foreign Application Priority Data

Jul. 14, 1988 [JP] Japan ................................. 63-175776

[51] Int. Cl.⁵ ........................................... G01R 31/28
[52] U.S. Cl. ............................... 324/158 R; 324/73.1; 371/22.5; 371/25.1
[58] Field of Search ............ 324/73 R, 73 AT, 158 R, 324/73.1; 371/21.1, 22.5, 25.1

[56] References Cited

U.S. PATENT DOCUMENTS

| | | | |
|---|---|---|---|
| 3,961,252 | 6/1976 | Eichelberger | 371/21.1 |
| 4,385,275 | 5/1983 | Delvigne | 324/73 r |
| 4,697,140 | 9/1987 | Saito et al. | 324/73 R |
| 4,701,920 | 10/1987 | Resnick et al. | 371/22.5 |
| 4,816,757 | 3/1989 | Hutchins | 324/158 R |
| 4,837,505 | 6/1989 | Mitsunobu | 324/158 R |

Primary Examiner—Ernest F. Karlsen

[57] ABSTRACT

An integrated circuit which can be operated in a test mode includes a test input terminal for instructing the switching between an actual use mode and a test mode, a plurality of input terminals, an AND gate for performing logic operations on the input signals from the input terminals, a plurality of flip-flops for storing each of the input signals from the remaining plurality of input terminals by using the outpout of the AND gate as a timing signal, a decoder for producing a test mode designating signal to select one test mode from a plurality of test modes in response to each of the outputs of the flip-flops, and a control circuit for operating a processing circuit in the test mode designated by the test mode designating signal in response to the test mode setting signal from the test input and the test mode designating signal from the decoder. The configuration of this circuit permits the testing of the signals from the output terminals of the integrated circuit without excessively increasing the number of input terminals necessary for the test mode.

9 Claims, 3 Drawing Sheets

INTEGRATED CIRCUIT AND METHOD FOR TESTING THE INTEGRATED CIRCUIT

BACKGROUND OF THE INVENTION

1. Field of the Invention

The present invention relates to an integrated circuit and a testing method for the integrated circuit, and more particularly to an integrated circuit having an input terminal for testing and a test-use logic circuit capable of setting a plurality of test modes and to a method for testing such an circuit.

2. Description of the Related Art

In the case of highly integrated semiconductor circuits, each semiconductor device of the circuit is tested before the circuit is completed in order to see if the device has the prescribed characteristics and performs the intended functions. However, as the functions of each device become more sophisticated it is increasingly inefficient to test every function of the device. It is therefore typical to test an integrated circuit chip by setting a test mode which is suitable for testing but different from the actual state of use. As the integrated circuit chips have more multi-functional in recent years, efforts have been made to improve test efficiency by providing an increasing number of test modes according to test purpose.

Heretofore, setting of such test modes has been accomplished by providing special test input terminals or pins for receiving test mode setting date. Additionally, a further special test input terminal is provided for switching the mode between actual use and test. Also, setting of test modes may be accomplished by allocating a specific terminal for mode setting at the time of test mode only.

In the above described arrangements, the former arrangement requires an increase in the number of pins, while the latter arrangement results in an increase in test time because the terminal allocated for test mode setting is assigned a role in the test mode and the terminal is not able to be tested in the test mode. Therefore, a longer test time is required for testing the integrated circuit in the actual use mode.

Thus, in view of the difficulties with the above describes arrangements, it is an object of the present invention to provide an integrated circuit capable of setting a plurality of test modes with a simple circuit by using only one input terminal as a test terminal for switching between the actual use and the test modes.

Another object of the present invention is to provide a method for testing such integrated circuits.

SUMMARY OF THE INVENTION

To achieve the present above objects, the invention provides an integrated circuit comprising:

(a) a test input terminal for instructing the switching between the actual use mode and the test mode; and (b) a test mode setting circuit including (b1) a memory circuit responsive to a timing signal which is a combinational logic signal of input signals from predetermined first input terminals of the integrated circuit, for storing an input signal from a second input terminal of the integrated circuit, and (b2) a decoder for setting a plurality of test modes in response to the output signal of the memory circuit.

The present invention also provides an integrated circuit comprising: a plurality of first input terminals for receiving input signals; a processing circuit that operates in the actual use mode in accordance with the signals from the first input terminals;

a test input terminal for receiving a test mode setting signal to instruct the switching between the actual use mode and the test mode;

logic operation means for performing logic operations in accordance with the combination of input signals from a second plurality of input terminals, the number of the second plurality of input terminals being small than the number that of the first plurality of input terminals, memory means for starting input signals from a third input terminals in response to the output from the logic operation means as a timing signal;

a decoder and deriving a test mode designating signal for selecting one mode from a plurality of test modes in response to the output from the memory means; and a test mode control circuit for operating the processing circuit in the test mode designated by the test mode designating signal in response to the test mode setting signal from the test input terminal and the test mode designating signal from the decoder.

Another embodiment of the present invention, the above described logic operation means is an AND gate.

Also, in another embodiment of the present invention, the memory means of the integrated circuit comprises a plurality of D-type flip-flops for receiving and storing each input signal from the third input terminals at each data input terminal in response to the falling or rising waveform of the output from the logic operation means.

In a further embodiment of the present invention, the decoder of the integrated circuit derives a test mode designating signal comprising a plurality of parallel bits, and the test mode control circuit has a plurality of AND gates each having one input for receiving each bit of the test mode designating signals and having the other input for receiving the test mode setting signal.

Another embodiment of the present invention provides an integrated circuit comprising: a plurality of first input terminals for receiving input signals; a processing circuit that operates in the actual use mode in accordance with the signals from the first input terminals; comprising, a test input terminal for receiving a test mode setting signal which switches between the actual use mode and the test modes;

logic operation means for performing logic operations in accordance with the combination of the input signals from a plurality of second input terminals the number of the second input terminals being smaller than the number of the first input terminals and memory means for storing input signals from a third input terminal in response to the output from the logic operation means as a timing signal;

the processing circuit being responsive to the test mode setting signal from the test input terminal and the output from the memory means, and operating in the test mode designated by the output from the memory means.

A further embodiment of the present invention provides a method of testing an integrated circuit which utilizes first an integrated circuit having a plurality of first terminals for receiving input signals and a processing circuit that operates in the actual use mode in accordance with the signals from the first input terminals, the integrated circuit further comprises, a test input terminal for receiving a test mode setting signal which switches between the actual use mode and the test mode, logic operation means for performing logic operations in accordance with the combination of input signals from a plurality of second input terminals, the number of the second input terminals being smaller than the number of the first terminals, memory means for storing input signals from a third input terminal in response to the output from the logic operation as a timing signal, a decoder for deriving a test mode designating signal and selecting one mode from a plurality of test modes in response to the output from the memory means and a test mode control circuit for operating the processing circuit in the test mode designated by the test mode designating signal in response to the test mode setting signal from the test input terminal and the test mode designating signal from the decoder the method of testing comprising the steps of:

(a) providing the integrated circuit;

(b) applying the test mode setting signal to the test input terminal;

(c) simultaneously and individually applying signals to the logic operating means for performing logic operations to the plurality of second input terminals, and also applying signals to the third input terminals for storing in the memory means during application of the test mode setting signal;

(d) operating the processing circuit in the test mode designated by the test mode designating signal from the decoder by the test mode control circuit and (e) comparing an output signal from the processing circuit to the predetermined values corresponding to the designated test mode.

In a further embodiment of the present invention the step of operating the processing circuit in the test develops a signal used to function the processing circuit in the test mode which is applied to at least one input terminal of either the plurality of second input terminals or the third input terminals having the signals for storing in the memory provided.

A further embodiment of the present invention provides a method of testing an integrated circuit which utilizes an integrated circuit having a plurality of first input terminals for receiving input signals and a processing circuit that operates in the actual use mode in accordance with the signals from the first input terminals, the integrated circuit comprises, a test input terminal for receiving a test mode setting signal which switches between the actual use mode and the test mode, logic operation means for performing logic operations in accordance with the combination of the input signals from a plurality of second input terminals, the number of the second input terminals being smaller than the number of the first terminals, and memory means for storing input signals from a third input terminal in response to the output from the logic operation means as a timing signal, the processing circuit being responsive to the test mode setting signal from the test input terminal and the output from the memory means, and operating in the test mode designated by the output from the memory means, the method of testing comprising the steps of:

(a) providing the integrated circuit;

(b) applying the test mode setting signal to the test input terminal;

(c) simultaneously and individually applying signals to the logic operating means for performing logic operations to the plurality of second input terminals, and also applying signals to the third input terminals for storing in the memory means during application of the test mode setting signal;

(d) operating the processing circuit in the test mode designated by the test mode designating signal from the decoder; and (e) comparing an output signal from the processing circuit to the predetermined values corresponding to the designated test mode.

According to an embodiment of the present invention after the mode is switched to the test mode by applying the test mode setting signal to the test input terminal, a plurality of test modes may be set through the terminals provided on the integrated circuit by storing and decoding the combinational logic signal of the input signals from a plurality of input terminals as a clock or timing signal, and input signals from another plurality of input or input/output terminals than the above input terminals.

The logic operation means is an AND gate, and the memory means may be comprised of a plurality of D-type flip-flops.

The decoder derives a test mode designating signal comprising a plurality of parallel bits. The test mode control circuit has a plurality of AND gates, the test mode setting signal being given in common to one input of each of the AND gates, and each bit of the test mode designating signal being given individually to the other input. Accordingly, when the test mode setting signal is being applied, a test mode designating signal comprising a plurality of bits is provided from the test mode control circuit to the processing circuit for operating the processing circuit in the test mode designated by the test mode designating signal.

The outputs of the processing circuit operating in the test mode are compared to the predetermined values or patterns corresponding to the test mode designating signal to check if the integrated circuit is functioning properly.

As discussed above, according to the present invention, a plurality of test modes can be set with a very simple circuit, which uses at least one test input terminal and a plurality of input ports or input/output ports, by means of hardware only and without complicated timing control. Therefore it is highly useful and practical for testing integrated circuit chips which have an increased amount of multi-functions and multi-pin configurations.

BRIEF DESCRIPTION OF THE DRAWING

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
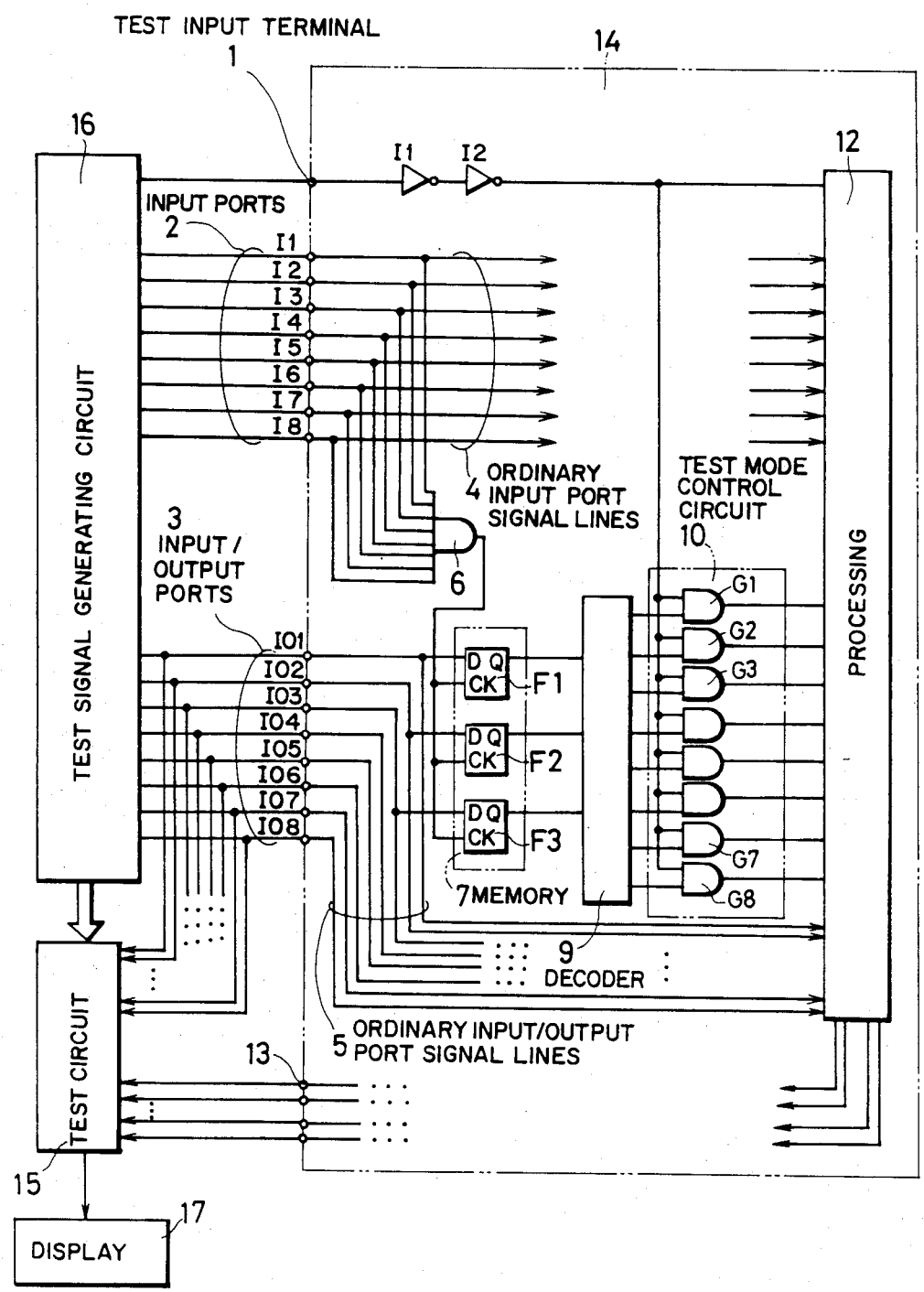
FIG. 1 is a block diagram of one embodiment of the present invention.

FIG. 1 is a diagram of one embodiment of the present invention illustrating a test mode setting circuit within an integrated circuit chip 14 having a test input terminal 1 for switching between an actual use mode and a test mode, eight input ports 2 (I1-I8), eight input/output ports 3 (I01-I08), output terminals 13, and various other terminals (which are not shown).

In the above described integrated circuit, a signal T for switching between the actual use mode and the test mode is input from the test input terminal 1 through two stages of inverters IN1 and IN2 to a processing circuit 12. In the present embodiment, the mode setting signal T goes to "L" (low level) for setting the actual use mode when a "L" signal is applied to the test input terminal 1, and the mode setting signal T goes "H" (high level) for setting the test mode when a "H" signal is applied to the test input terminal 1. In the actual use mode, the eight input ports 2 and the signal lines 4 feed input signals to a processing circuit 12 of the integrated circuit as ordinary input ports, and feed the input signals to an AND gate 6 simultaneously. The AND operation of the input signals I1-I8 from the input ports 2 by the AND gate 6 is provided to the clock input CK of each of D-type flip-flops F1-F3 as a timing signal for switching to the test mode. It is not necessary to provide inputs from all eight input ports 2 to the AND gate 6, but in the present embodiment, all eight inputs are fed so as to alleviate the restrictions by an inhibit code in the actual use mode.

From the input/output terminals, which are appropriately selected by the input/output ports 3 of the integrated circuit other than the test input terminal 1 and the input ports 2, signal from the terminals I01-I03 are given to the data input terminals D of the flip-flops F1-F3 in the memory 7. Thereby, and the signals from the terminals I01-I03 are stored in the memory 7, by using the output signal of the AND gate 6 as a clock or timing signal.

The output signal from the flip-flops F1-F3 of the memory 7 are fed to a decoder 9, where a prescribed conversion is performed to produce signals for instructing the contents of a test, etc. The outputs of the decoder 9 are input to a test mode control circuit 10 to produce signals T1-T8 for issuing the corresponding test mode commands. The test mode setting signal T is also input to the test mode control circuit 10, and the test mode command is issued when the signal T is in the "H" state. The signals from the respective terminals I01-I08 of the input/output ports 3 are fed to the circuit 12 of the integrated circuit through signal lines 5 of the input/output ports 3.

The decoder 9 derives a test mode designating signal for selecting one test mode from a plurality of test modes in response to the outputs of the flip-flops F1-F3, and provides the signal to the test mode control circuit 10. The test mode designating signal derived by the decoder 9 includes a plurality of parallel bits (8 bits in the present embodiment).

The test mode control circuit 10 has a plurality of AND gates G1-G8 (eight gates in the present embodiment) corresponding to the respective bits of the test mode designating signal. The test mode setting signal that is the output of the inverter I2 is fed in common to one input of each of the AND gates G1-G8, while each bit of the test mode designating signal is fed individually to the other input of each of the AND gates G1-G8.

When a low level signal is applied to the test input terminal 1 to set the mode to actual use, a processing circuit 12 executes the predetermined and desired program in response to the signals from the input ports 2 and the input/output ports 3 to perform operations, introduce the results to the input/output ports 3, and output to the output ports 13.

A discussion of the operation in the test mode setting of the integrated circuit being tested of the above described configuration follows.

After the mode is switched from the actual use mode to the test mode by inputting the "H" level setting signal T to the test input terminal 1, the signals from the terminals I1-I8 are given in such a way that the output signal of the AND gate 6 changes "L" by the input ports 2→"H"→"L". The 3-stage D-type flip-flops, which are included in the memory 7, change their outputs synchronously according to the falling or the front edge of the clock generated by the output of the AND gate 6 so that the signals from the terminals I01-I03 are appropriately selected from the input/output ports 3 to be stored and output. The above three inputs are decoded by the decoder 9 into eight bit output signals. This permits setting of eight different test modes T1-T8. The test mode control circuit 10 whose mode is set in a general manner by the setting signal T outputs the test modes T1-T8 signals to feed to the processing circuit 12.

Figure 2:
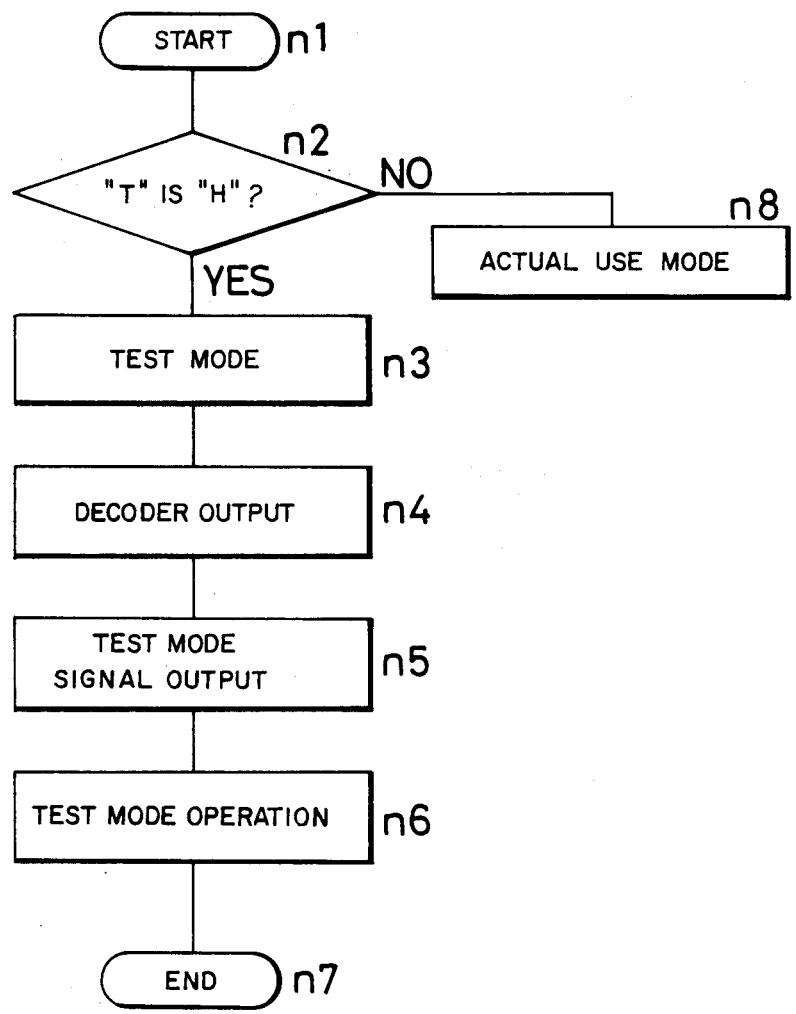
FIG. 2 is a flowchart explaining the operation in the test mode of the integrated circuit 14 illustrated in FIG. 1.

An explanation of the test mode operation of the semiconductor integrated circuit 14 follows with reference to FIG. 2. The process moves from Step n1 to Step n2 where the signal T from a test signal generating circuit 16 through the test input terminal 1 and it is determined whether the signal T is "H" or not. If the signal is "H", the process moves to the test mode which starts at Step n3, and the processing circuit 12 is disabled for responding to the input signals from the circuit 16 through the input ports 2 and the input/output ports 3. In Step n4, the decoder 9 responds to the output of the memory 7, and the decoder 9 provides the test mode designating signal at Step n5. In Step n6, the test mode control circuit 10 provides the test mode designating signal to the processing circuit 12. Thereby the processing circuit 12 operates in the test mode as designated by the test mode designating signal and introduces the results to the input/output ports 3 and the output terminals 13. If, the signal T from the test input terminal 1 is determined to be "1" at Step n2 the process moves to the actual use mode which starts at Step n8. A test circuit 15 responds to the output of the test signal generating circuit 16, receives the signal designating the test mode operation to be performed in the processing circuit 12 of the integrated circuit 14, compares the predetermined signals corresponding to the designated test mode to the outputs from the output terminals 13, checks if the processing circuit 12 is functioning properly, and displays the result of the display 17 of whether the functioning normal or whether there is a problem.

Figure 3:
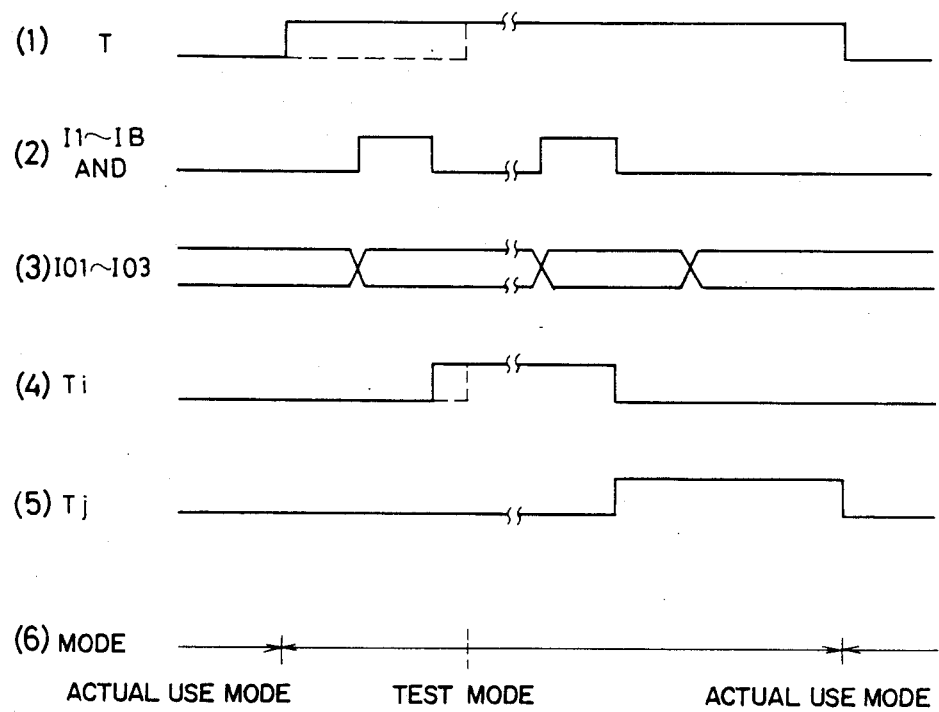
FIG. 3 is a timing chart explaining the operation in the test mode of the integrated circuit 14 illustrated in FIG. 1.

The timing chart of the above operation is illustrated in FIG. 3. In this timing chart, Ti and Tj represent the test mode signals (any of T1-T3) which respectively correspond to the test mode setting data from the terminals I01-I03. Also, the broken lines in the T signal and Ti signal represent the timing when the mode is switched from the actual use mode to the test mode after the data of the input/output ports I01-I03 have been stored in the test mode setting procedure.

In the test mode of the present embodiment, it should be noted that such inputs from the input ports 2 that make the AND gate 6a "h" level (that is, the I1-I8 signals are all "H" level inputs) will constitute an inhibit code except in the test mode setting. However, this inhibit code does not impose a substantial restriction to the integrated circuit. Specifically, in microcomputers, etc. used in electronic equipment systems which constitute a key matrix having a plurality of key inputs, if the key inputs are used for the input ports 2, the inhibit code becomes effective only when all the key inputs are active. Therefore, the restriction in the test mode is minor.

In another embodiment of the present invention when the test input terminal 1 kept at a high level for operating the processing circuit 12 in the test mode, and when the input signals for designating the test mode is applied to the terminals I01-I03 of the input/output ports 3, the input signals at the terminals I01-I03 of the input/output ports 3 for designating the test mode are stored into the memory 7 with all of the I1-I8 signals of the input ports 2 at the "H" level. Thereby the processing circuit 12 is ready for operating in the designated test mode. After the signals have been stored into the memory 7, a data signal for the designated test mode operation is then provided from at least one terminal either at the input ports 2 or at the input/output ports 3 for the processing circuit 12 to perform the operation in the designated test mode.

The present invention has the advantage that while using the input ports 2 and the terminals I01-I03 of the input/output ports 3 in the test mode, a signal used for functioning of the test mode can be applied to at least one terminal either at the input ports 2 or at the input/output ports 3. Thereby, it is possible to test the input ports 2 and the input/output ports 3 to which the signal used for the function of the test mode is applied.

The outputs of the processing circuit 12 operating in the test mode may be fed from the input/output ports 3 to the test circuit 15, as well as or instead of, from the output terminals 13 to the test circuit 15.

The decoder 9 may be so configured that the test mode designating signal is introduced to the AND gates G1-G8 in 8 bits in accordance with a plurality of sets of 3-bit data provided from the terminals I01-I03 of the input/output ports 3 and is stored in the memory 7 in response to a plurality of time sequential timing signals. Thus, with a relatively small number of flip-flops F1-F3, a multiplicity of test modes can be set by the decoder 9.

In a further embodiment of the invention, the circuit may be so configured that the test mode of the processing circuit 12 can be selected and designated by using the output of the memory 7. In this embodiment, the decoder 9 and the test mode control circuit 10 may be dispensed.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. An integrated circuit comprising:
   (a) a test input terminal for receiving a mode signal which switches between an actual use mode and a test mode; and
   (b) test mode setting means for setting one of a plurality of test modes, said test mode setting circuit including,
      (b1) means for developing a timing signal for logic operations performed on a plurality of first input signals of the integrated circuit,
      (b2) a memory for storing a signal from a second plurality of input terminals of the integrated circuit in response to said timing signal, and
      (b3) a decoder for developing a signal which sets one of the plurality of test modes.

2. An integrated circuit comprising:
   a first plurality of input terminals for receiving input signals;
   processing means for operating the integrated circuit in an actual use mode or a test mode;
   a test input terminal for receiving a test mode setting signal which switches between said actual use mode and said test mode;
   logic operation means for developing a timing signal by performing logic operations in response to input signals from a second plurality of input terminals;
   a memory for storing said input signals from a portion of said second plurality of input terminals in response to said timing signal;
   a decoder for deriving a test mode designating signal; and
   test mode control means for operating said processing means in one of a plurality of test modes as designated by said test mode designating signal in response to said test mode setting signal.

3. An integrated circuit as set forth in claim 2 wherein said logic operation means comprises an AND gate.

4. An integrated circuit as set forth in claim 2 wherein said memory comprises a plurality of D-type flip-flops for receiving and storing said portion of input signals from said second plurality of input terminals in response to an edge of a waveform of said timing signal.

5. An integrated circuit as set forth in claim 2 wherein said test mode designating signal comprises a plurality of parallel bits, and said test mode control means comprises a plurality of AND gates, each of said AND gates having one input for receiving each bit of said test mode designating signals and having a second input for receiving said test mode setting signal.

6. An integrated circuit comprising:
   a first plurality of input terminals for receiving input signals;
   processing means for operating the integrated circuit in an actual use mode or a test mode;
   a test input terminal for receiving a test mode setting signal which switches between said actual use mode and said test mode;
   logic operation means for developing a timing signal by performing logic operations in in response to input signals from a second plurality of input terminals; and
   memory means for storing said input signals from said second plurality of input terminals in response to said timing signal;
   said processing means operating in one of a plurality of test modes as designated by said input signals stored in said memory means in response to said test mode setting signal.

7. A method of testing an integrated circuit, the integrated circuit including,
   a first plurality of input terminals for receiving input signals,
   processing means for operating the integrated circuit in an actual use mode or a test mode in accordance with said input signals from said plurality of first input terminals,
   a test input terminal for receiving a test mode setting signal which switches between said actual use mode and said test mode,
   logic operation means for developing a timing signal by performing logic operations in response to input signals from a second plurality of input terminals,
   memory means for storing said input signals from said second plurality of input terminals,
   a decoder for deriving a test mode designating signal, and
   test mode control means for operating said processing means in one of a plurality of test modes as designated by said test mode designating signal, the method comprising the steps of:
   (a) positioning the integrated circuit for testing;
   (b) applying said test mode setting signal to said test input terminal;
   (c) simultaneously and individually providing signals to said logic operation means;
   (d) performing logic operations to a portion of the signals from said second plurality of input terminals;
   (e) storing the remaining portion of said second plurality of input terminals in said memory means;
   (f) operating said processing means in one of said plurality of test modes as designated by said test mode designating signal from said decoder in response to said test mode control means; and
   (g) comparing an output signal from said processing means to predetermined values developed by said one test mode.

8. A method of testing an integrated circuit as set forth in claim 7 wherein said step (f) uses a signal to operate said processing means in said one test mode and said signal is input to at least one input terminal of the portion of said second plurality of input terminals or of the remaining portion of said second plurality of input terminals to which the signals for storing in said memory means were provided.

9. A method of testing an integrated circuit, the integrated circuit including,
   a first plurality of input terminals for receiving input signals,
   processing means for operating in an actual use mode or a test mode in accordance with said input signals from said plurality of first input terminals,
   a test input terminal for receiving a test mode setting signal which switches between said actual use mode and said test mode,
   logic operation means for developing a timing signal by performing logic operations in response to input signals from a second plurality of input terminals, and
   memory means for storing said input signals from said second plurality of input terminals and developing a test mode designating signal therefrom,
   said processing means being responsive to said test mode setting signal from said test input terminal and said test mode designating signal from said memory means, and operating in one of a plurality of test modes as designated by said test mode designating signal from said memory means,
   the method comprising the steps of:
   (a) positioning the integrated circuit for testing;
   (b) applying said test mode setting signal to said test input terminal;
   (c) simultaneously and individually providing signals to said logic operation means;
   (d) performing logic operations to the signals from a portion of said second plurality of input terminals;
   (e) storing the remaining portion of said second plurality of input terminals in said memory means;
   (f) operating said processing means in one of said plurality of test modes as designated by said test mode designating signal; and
   (g) comparing an output signal from said processing means to predetermined values developed by said one test mode.

* * * * *